(12) United States Patent
Shimazu et al.

(10) Patent No.: US 11,830,232 B2
(45) Date of Patent: Nov. 28, 2023

(54) IMAGE JUDGMENT APPARATUS AND IMAGE JUDGMENT METHOD

(71) Applicant: CANON KABUSHIKI KAISHA, Tokyo (JP)

(72) Inventors: Satoshi Shimazu, Kawasaki (JP); Hajime Kaneko, Kodaira (JP)

(73) Assignee: Canon Kabushiki Kaisha, Tokyo (JP)

( * ) Notice: Subject to any disclaimer, the term of this patent is extended or adjusted under 35 U.S.C. 154(b) by 733 days.

(21) Appl. No.: 17/022,361

(22) Filed: Sep. 16, 2020

(65) Prior Publication Data

US 2021/0099610 A1 Apr. 1, 2021

(30) Foreign Application Priority Data

Sep. 26, 2019 (JP) .................................. 2019-176045

(51) Int. Cl.
| | |
|---|---|
| *H04N 1/393* | (2006.01) |
| *G06V 10/25* | (2022.01) |
| *H04N 5/262* | (2006.01) |
| *H04N 1/409* | (2006.01) |
| *H01L 21/66* | (2006.01) |
| *G06T 7/00* | (2017.01) |
| *G01N 21/88* | (2006.01) |
| *G06V 10/764* | (2022.01) |

(52) U.S. Cl.
CPC ......... *G06V 10/25* (2022.01); *G01N 21/8851* (2013.01); *G06T 7/001* (2013.01); *G06V 10/764* (2022.01); *H01L 22/00* (2013.01); *H01L 22/34* (2013.01); *H04N 1/3935* (2013.01); *H04N 1/4092* (2013.01); *H04N 5/2628* (2013.01)

(58) Field of Classification Search
CPC .. G06V 10/25; G06V 10/764; G06V 2201/06; G01N 21/8851; G01N 21/94; G01N 2021/8854; G01N 2021/8887; G01N 2021/945; G06T 7/001; G06T 7/11; G06T 2207/10024; G06T 2207/20081; G06T 2207/30141; G06T 2207/30168; H01L 22/00; H01L 22/34; H04N 1/3935; H04N 1/4092; H04N 5/2628
See application file for complete search history.

(56) References Cited

FOREIGN PATENT DOCUMENTS

JP 2016-040650 A 3/2016

*Primary Examiner* — Elias Ullah
(74) *Attorney, Agent, or Firm* — Venable LLP

(57) ABSTRACT

An image judgment apparatus stores, in a memory, a judgment model configured to learn about each of the plurality of judgment items based on first data corresponding to an image as a reference with which to judge good and second data corresponding to an image as a reference with which to judge not good, sets a plurality of magnifications for each of the plurality of judgment items, segments part of the image, generates image data at the plurality of magnifications from the segmented image, inputs the generated image data corresponding to each of the plurality of magnifications to the judgment model, and judges, based on output results from the judgment model, whether the quality of the image is good or not good with respect to each of the plurality of judgment items.

20 Claims, 8 Drawing Sheets

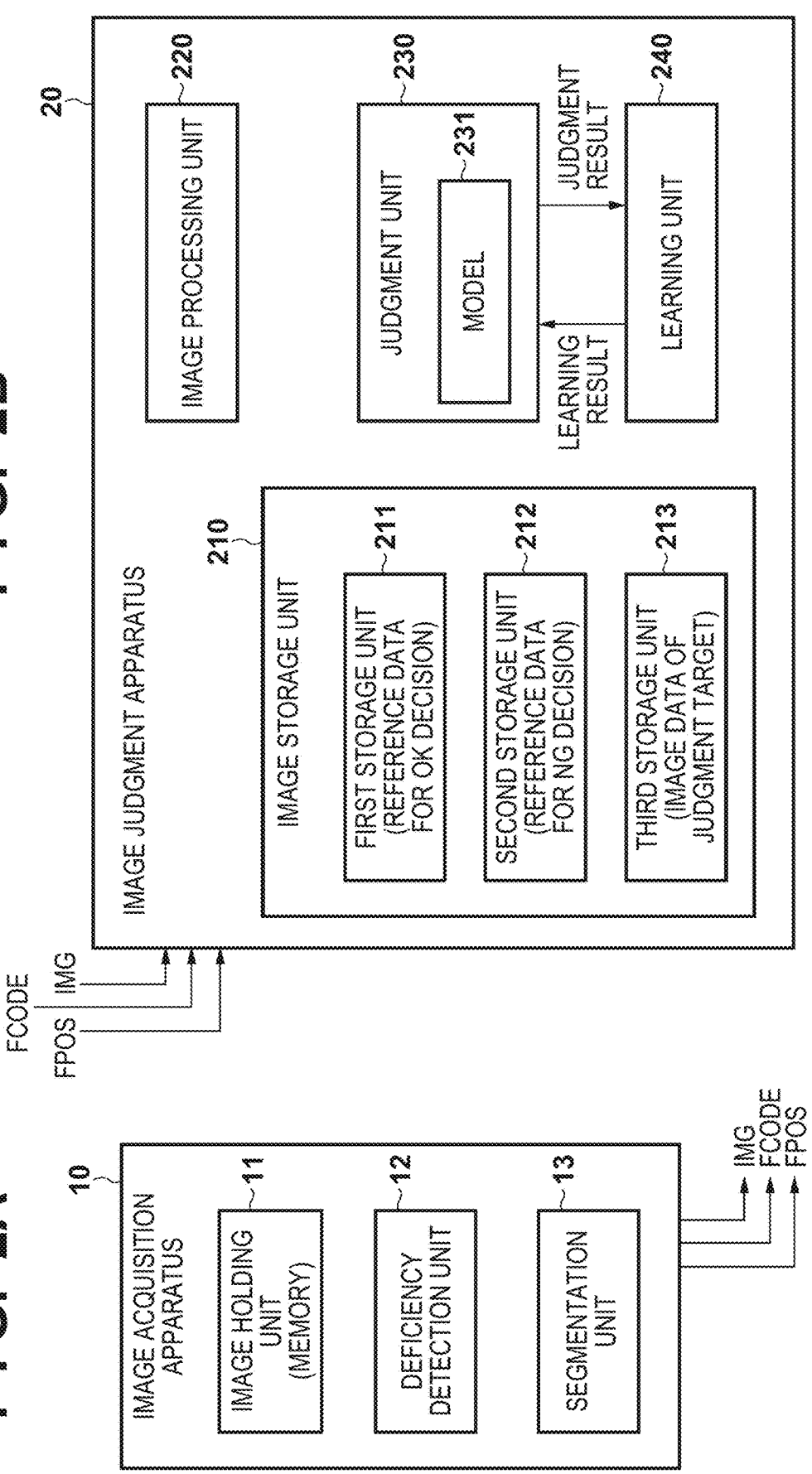

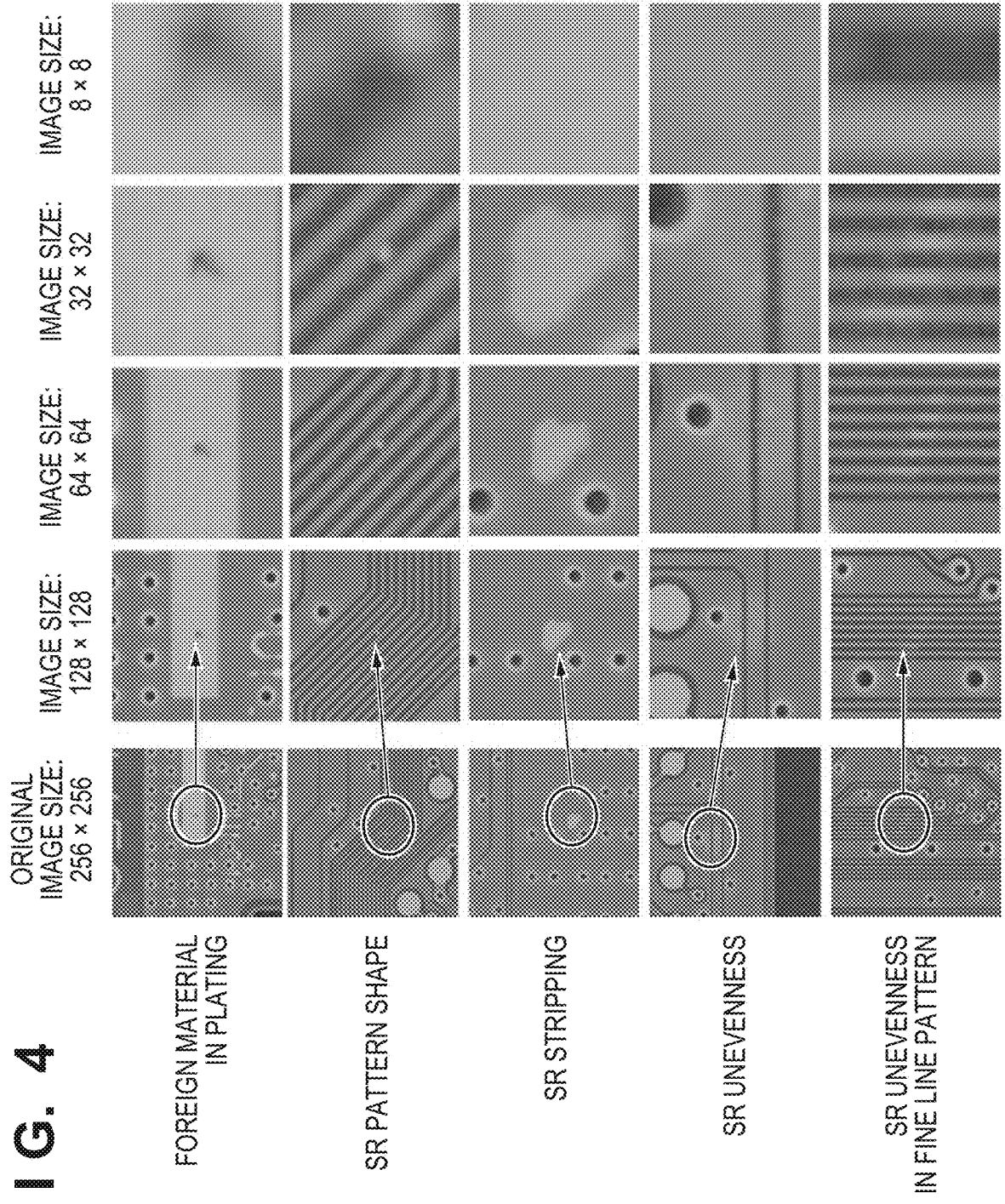

FIG. 7

- IMAGE1: 64 PIXELS x 64 PIXELS
  - NG CORRECT ANSWER RATE     70%
  - OK CORRECT ANSWER RATE     95%
  - True_NG CORRECT ANSWER RATE     90%

- IMAGE2: 128 PIXELS x 128 PIXELS
  - NG CORRECT ANSWER RATE     70%
  - OK CORRECT ANSWER RATE     90%
  - True_NG CORRECT ANSWER RATE     85%

- RESULT OF ENSEMBLE
  - NG CORRECT ANSWER RATE     80%
  - OK CORRECT ANSWER RATE     93%
  - True_NG CORRECT ANSWER RATE     100%

IMAGE JUDGMENT APPARATUS AND IMAGE JUDGMENT METHOD

BACKGROUND OF THE INVENTION

Field of the Invention

The present invention relates to an image judgment apparatus and an image judgment method, and particularly to, an image judgment apparatus and an image judgment method for inspecting the manufacturing quality of, for example, a printed substrate.

Description of the Related Art

Conventionally, there is known a technique for judging whether an image has a deficiency by using a computer incorporating an AI function. For example, Japanese Patent Laid-Open No. 2016-040650 discloses an apparatus that acquires image data by capturing an image of a surface of a semiconductor substrate using an image capturing apparatus, analyzes the image data, and judges whether there is a deficiency in the surface of the semiconductor substrate. When performing image analysis, the apparatus acquires an image indicating a deficiency portion and automatically classifies the image. In this automatic classification, the apparatus uses a knowledge engineering technique such as learning type classification, rule-based classification, or ensemble learning. More specifically, according to Japanese Patent Laid-Open No. 2016-040650, a plurality of classifiers incorporated in a host computer analyze the feature amount vector obtained from an image and classify the image based on the number of weighted votes.

The related art described above has a problem of being insufficient in judgment accuracy. For example, when a skilled expert in substrate inspection verifies the judgment result obtained by the apparatus, a substrate that is still in a good state is judged deficient. In particular, when there are many judgment target items, the number of wrong judgments increases.

In the first place, semiconductor substrate inspection takes much human resources and time. The inspection accuracy greatly depends on the skill of the expert. Accordingly, this inspection takes much cost (time and expense), and there has been demand for a long time for reduction in the cost by automation. Recently, attempts have been made to automate substrate inspection by using the AI technology that has been considerably developed. However, as described above, sufficient judgment accuracy cannot be obtained so far.

SUMMARY OF THE INVENTION

Accordingly, the present invention is conceived as a response to the above-described disadvantages of the conventional art.

For example, an image judgment apparatus and an image judgment method according to this invention are capable of accurately performing inspection judgment on, for example, printed substrates and semiconductor substrates.

According to one aspect of the present invention, there is provided an image judgment apparatus that judges quality of an image by using a plurality of judgment items, the apparatus comprising: a judgment model configured to learn about each of the plurality of judgment items based on first data corresponding to an image as a reference with which to judge good and second data corresponding to an image as a reference with which to judge not good; a setting unit configured to set a plurality of magnifications for each of the plurality of judgment items; a generating unit configured to segment part of the image and generate image data at the plurality of magnifications set by the setting unit from the segmented image; and a judgment unit configured to input, to the judgment model, the image data, corresponding to each of the plurality of magnifications, generated by the generating unit and judge, based on output results from the judgment model, whether the quality of the image is good or not good with respect to each of the plurality of judgment items.

According to another aspect of the present invention, there is provided an image judgment method in an image judgment apparatus that judges quality of an image by using a plurality of judgment items, the method comprising: storing, in a memory, a judgment model configured to learn about each of the plurality of judgment items based on first data corresponding to an image as a reference with which to judge good and second data corresponding to an image as a reference with which to judge not good; setting a plurality of magnifications for each of the plurality of judgment items; segmenting part of the image and generating image data at the plurality of magnifications from the segmented image; and inputting, to the judgment model, the generated image data corresponding to each of the plurality of magnifications and judging, based on output results from the judgment model, whether the quality of the image is good or not good with respect to each of the plurality of judgment items.

The invention is particularly advantageous since it is possible to more accurately judge, for example, the presence/absence of a deficiency in a surface of a printed substrate or semiconductor substrate based on the image data acquired by capturing an image of the surface.

Further features of the present invention will become apparent from the following description of exemplary embodiments (with reference to the attached drawings).

BRIEF DESCRIPTION OF THE DRAWINGS

FIGS. 2A and 2B are block diagrams showing the functional arrangements of an image acquisition apparatus and an image judgment apparatus;

FIG. 4 is a view showing the relationship between segmented images corresponding to the types of deficiencies found in a surface of a printed substrate and the partial images segmented from the images;

FIG. 7 is a view for explaining combinations of segmentation sizes concerning one deficiency item;

DESCRIPTION OF THE EMBODIMENT

Figure 1:
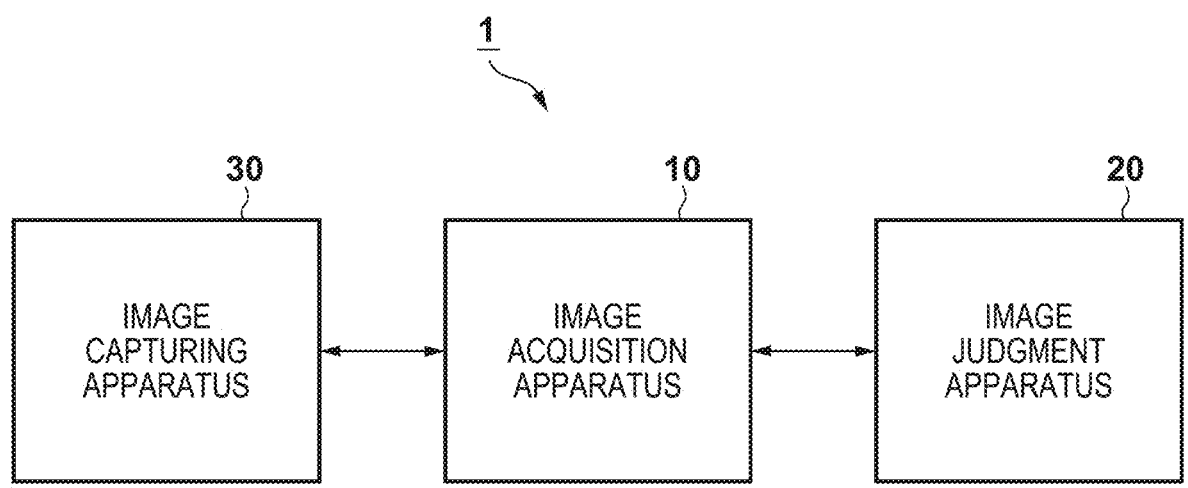
FIG. 1 is a block diagram showing an outline of the arrangement of an image judgment system according to an exemplary embodiment of the present invention.

Exemplary embodiments of the present invention will now be described in detail in accordance with the accompanying drawings. It should be noted that the following embodiments are not intended to limit the scope of the appended claims. A plurality of features are described in the embodiments. Not all the plurality of features are necessarily essential to the present invention, and the plurality of features may arbitrarily be combined. In addition, the same reference numerals denote the same or similar parts throughout the accompanying drawings, and a repetitive description will be omitted.

Note that in this specification, a "substrate" includes a semiconductor substrate and a printed substrate manufactured by a semiconductor manufacturing process and a head substrate provided with print elements, wirings, and the like, which is manufactured by using the manufacturing technique and used as the head chip of an inkjet printhead.

In addition, the term "inspection" referred in this specification means to inspect the state of a surface of a transfer member or the like used in a transfer-type inkjet printing apparatus in addition to a semiconductor substrate, a printed substrate, and a head substrate like those described above. This inspection inspects the presence/absence of a scratch on a surface of a "substrate" or transfer member, the presence/absence of adhesion of a foreign material, the presence/absence of soldering unevenness, the presence/absence of soldering stripping, the presence/absence of plate stripping, and the like. In addition, the above term "inspection" means to inspect the quality of an inkjet printhead by inspecting the image itself printed on a printing medium by the inkjet printhead.

Described here is a specific example of checking the image data obtained by capturing an image of a surface of a substrate such as a printed substrate or glass substrate by using an image capturing apparatus and detecting a deficiency such as a scratch caused on the substrate or the presence/absence of adhesion of a foreign material adhering to the substrate based on the image data.

FIG. 1 is a block diagram showing the arrangement of an image judgment system (to be referred to as a system hereinafter) as an exemplary embodiment of the present invention.

As shown in FIG. 1, a system 1 includes an image capturing apparatus 30 that generates image data by capturing an image of a surface of a printed substrate as an inspection target, an image acquisition apparatus 10 that acquires image data, and an image judgment apparatus 20 that acquires image data from the image acquisition apparatus 10 and judges the image. The image acquisition apparatus 10 and the image judgment apparatus 20 are computers, each including a CPU and a storage device (memory) that stores image data and judgment results. The image judgment apparatus 20 can, for example, issue an instruction to execute the processing described later and make settings with a keyboard, a Mouse®, and the like.

FIGS. 2A and 2B are block diagrams showing the functional arrangements of the image acquisition apparatus and the image judgment apparatus. FIG. 2A is a block diagram showing the functional arrangement of the image acquisition apparatus 10. FIG. 2B is a block diagram showing the functional arrangement of the image judgment apparatus 20.

As shown in FIG. 2A, the image acquisition apparatus 10 stores the image data received from the image capturing apparatus 30 in an image holding unit 11 constituted by an SSD memory and the like.

A deficiency detection unit 12 detects the presence/absence of a deficiency in the image data stored in the image holding unit 11. More specifically, the deficiency detection unit 12 holds the image data acquired by capturing an image of a printed substrate having an excellent surface state as reference image data (IREF), and compares the reference image data with the image data received from the image capturing apparatus 30. This reference image data is the data of faultless image or the data of an image with few faults. The deficiency detection unit 12 extracts corresponding pixels of the two images which have significant difference in brightness value or density value, and estimates what type of deficiency the received image has based on the distribution of the extracted pixels and the degree of difference in brightness value or density value. These processes can be implemented by using a known pattern recognition technique.

Assume that an image is acquired by capturing an image of a pattern wiring portion of a printed substrate. In this case, when the surface state of the portion is good, the portion is recognized as a region having uniform density (brightness) without any change in density (brightness). In contrast to this, if the pattern wiring has plating stripping, the region with uniform density (brightness) has a place where density (brightness) discontinuously differs. Since such a place is locally distinctive, the place of occurrence and the type of deficiency can be estimated by pattern recognition.

Assume that the above deficiency detection processing has estimated that there is a deficiency. In this case, the deficiency detection unit 12 generates a deficiency code (FCODE) indicating the type of deficiency and deficiency position information (FPOS). Images estimated to have deficiencies are classified into the following three types. The first one is an NG image in terms of quality standards. This image is classified as an NG image by AI learning (true_NG image). The second one is an image classified as an OK image in terms of the quality standards even though flaw and dust are recognized by human vision but is classified as an NG image by AI learning (NG image). The third one is an image classified as an OK image in terms of the quality standards without any flaw and dust recognized by human vision and is also classified as an OK image by AI learning (OK image).

A segmentation unit 13 performs segmentation processing for image data estimated to have a deficiency. At this time, the image acquisition apparatus 10 transfers the image data (IMG) segmented by the segmentation unit 13 together with a deficiency code (FCODE) and deficiency position information (FPOS) to the image judgment apparatus 20.

As shown in FIG. 2B, the image judgment apparatus 20 receives the image data (IMG) segmented by the segmentation unit 13. An image storage unit 210 includes a first storage unit 211 that saves reference image data for judging that an inspection result of a printed substrate is good (OK), a second storage unit 212 that saves reference image data for judging no good (NG), and a third storage unit 213 that saves the image data of a judgment target. The image storage unit 210 is constituted by an SRAM, DRAM, SSD, and the like. An image processing unit 220 enlarges an image of a judgment target based on an input deficiency code (FCODE). A judgment unit 230 includes an OK/NG judgment model (neural network) 231 (to be simply referred to as a model hereinafter) that outputs information indicating that the inspection result on the segmented image data is OK or NG. The model 231 has a plurality of weighting coefficients.

Note that the first storage unit 211 stores a plurality of OK judgment reference data for each type of deficiency, and the second storage unit 212 stores a plurality of NG judgment reference data for each type of deficiency. These data are used for judgment performed by the judgment unit 230. The types of deficiencies in printed substrates will be described later.

The image judgment apparatus 20 includes a learning unit 240 having an AI function of learning to which part of an image it pays attention when segmenting and how to execute image analysis every time judging the presence/absence of a deficiency in a printed substrate by using the image data input from the image acquisition apparatus 10. The system 1 sets a printed substrate as an inspection target and various events occurring in a surface of the printed substrate as judgment items for image judgment, and performs image judgment according to the judgment items.

Note that the learning unit 240 inputs various reference images for each judgment item and changes weighting coefficients based on judgment results when making the model learn. Repeating this learning process will optimize the weighting coefficients of the model 231. The judgment unit 230 inputs the image data of a judgment target to the learned model 231 when judging the presence/absence of a deficiency in a printed substrate, and the model 231 outputs a result indicating the presence/absence of a deficiency in the image.

Segmentation from image data will be described with reference to FIGS. 3A to 3C.

Figure 3A:
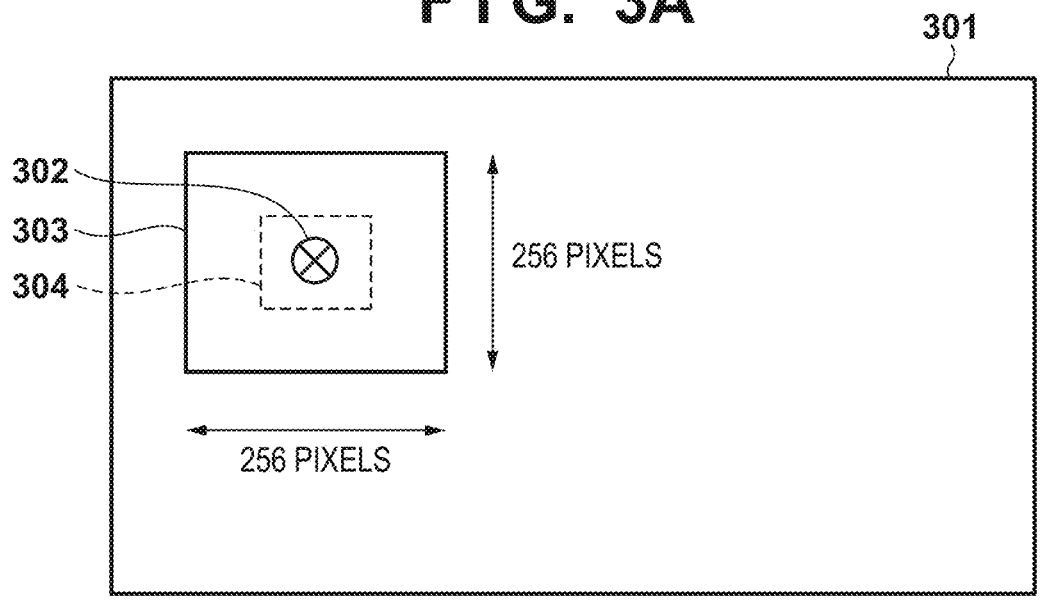
FIGS. 3A, 3B, and 3C are views for explaining segmentation from image data.

FIG. 3A shows the relationship between an image of a printed substrate acquired by the image acquisition apparatus 10 from the image capturing apparatus 30 and an image segmented by the segmentation unit 13. As shown in FIG. 3A, the deficiency detection unit 12 generates deficiency position information (FPOS) by specifying a deficiency position 302 from an original image 301 acquired from the image capturing apparatus 30. The segmentation unit 13 then segments an image 303 of 256×256 pixels centered on the deficiency position 302.

Figure 3B:
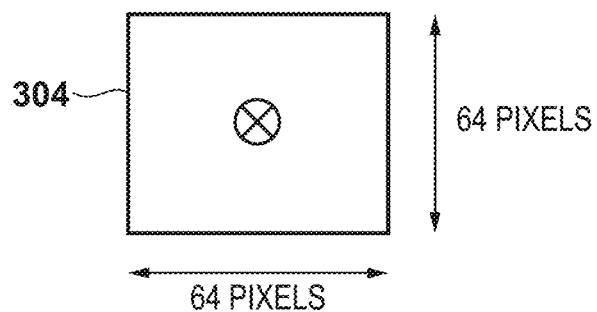

FIG. 3B is a view showing an image 304 obtained by segmenting a 1/16 {(¼)×(¼)} region from the segmented image 303 shown in FIG. 3A. As is obvious from the comparison between FIGS. 3A and 3B, the image 304 is acquired by segmenting a 64 (vertical)×64 (horizontal) pixel image from the 256 (vertical)×256 (horizontal) pixel image 303 in the vertical and horizontal directions centered on the deficiency position 302. The image acquisition apparatus 10 transfers image data (IMG) representing the segmented image 303 to the image judgment apparatus 20. The image processing unit 220 generates image data representing the image 304.

The image processing unit 220 generates image data representing the image 304 based on the value of a deficiency code (FCODE) and the value of deficiency position information (FPOS). If, for example, the deficiency code (FCODE) indicates another type of deficiency, the image processing unit 220 generates image data representing 32 pixels×32 pixels of a portion of the image 303.

Figure 3C:
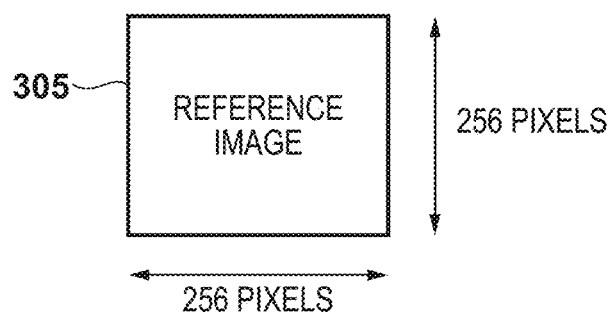

FIG. 3C shows an image for reference (reference image) used for image judgment stored in the image storage unit 210 of the image judgment apparatus 20. As shown in FIG. 3C, a reference image 305 has the same size (256 pixels×256 pixels) as that of an image as a judgment target (comparison target). This reference image includes an image for normal (OK) decision and an image for NG decision, that is, for judging that there is a deficiency, for each type of deficiency. As described above, these images are respectively stored in the first storage unit 211 and the second storage unit 212. The images are used when the learning unit 240 makes the model 231 learn described above.

FIG. 4 shows the relationship between segmented images corresponding to the types of deficiencies found in a surface of a printed substrate and the partial images segmented from the images. FIG. 4 shows the types of deficiencies on the left side in the vertical direction and the image sizes of the respective images on the upper side in the horizontal direction.

Note that images having the same size are displayed in FIG. 4. With reference to the images of a size of 256 pixels×256 pixels arranged in the leftmost column, the 128×128 images, the 64×64 images, the 32×32 images, and the 8×8 images are displayed side by side in the right direction. The images displayed on the right side of the reference images are enlarged to have the same size as that of the reference images when displayed on the display or printed. Accordingly, when an image having a size of 128 pixels×128 pixels is generated from an image having a size of 256 pixels×256 pixels, this operation will be referred to as 2× magnification image generation. Likewise, the generation of a 64×64 image, that of a 32×32 image, and that of an 8×8 image will be respectively referred to as 4× magnification image generation, 8× magnification image generation, and 32× magnification image generation.

FIG. 4 displays a reference image and four enlarged images segmented from the reference image with respect to each of five deficiency types including a foreign material in plating, SR (solder resist) pattern shape, SR stripping, SR (solder resist) unevenness, and SR unevenness in fine line pattern.

Note that deficiency types are not limited to the above examples. For example, in addition to them, deficiency types include a copper plating color, silk shape, pad shape, and the position of a hole such as a through hole.

Figure 5:
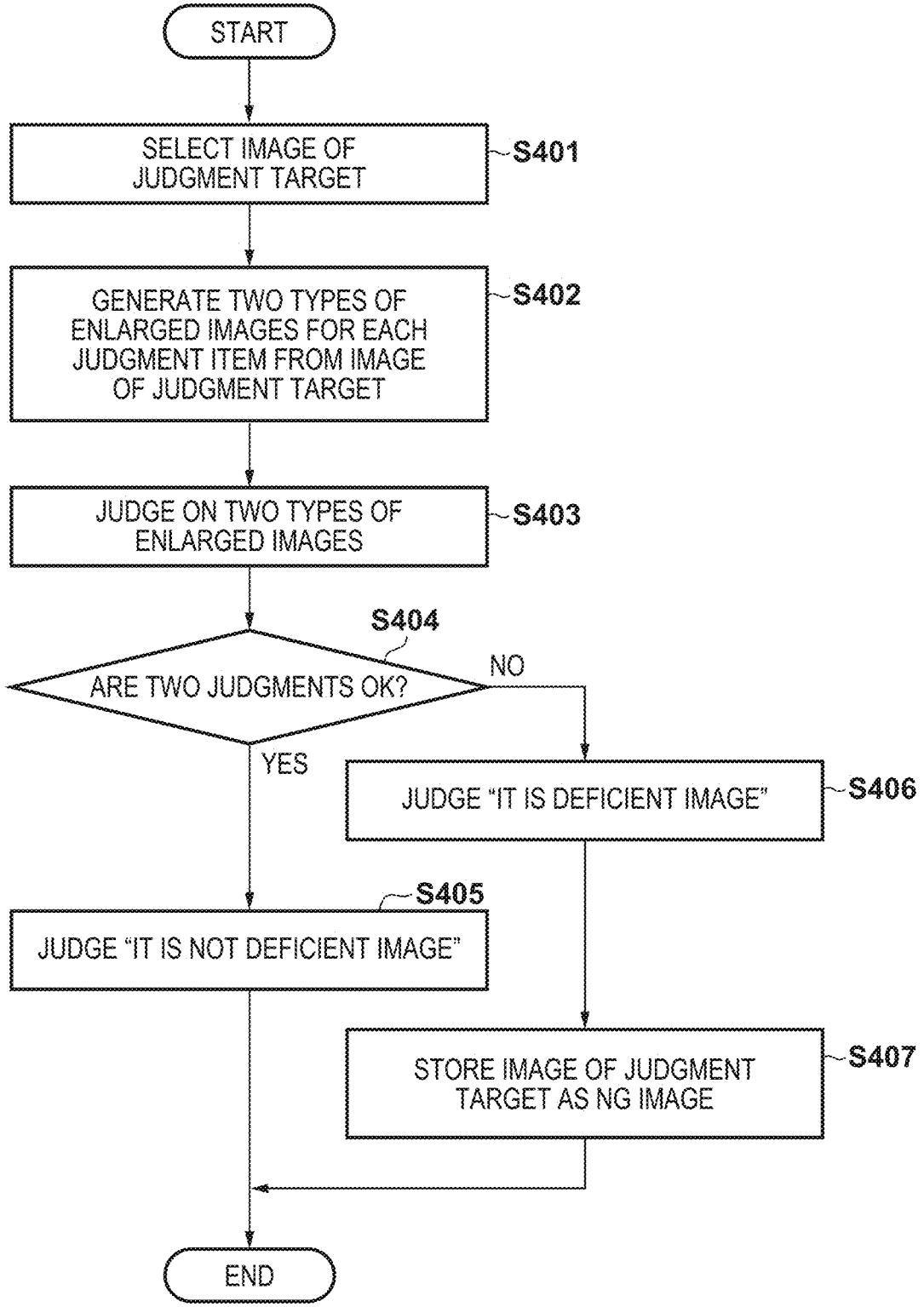
FIG. 5 is a flowchart showing processing of judging the presence/absence of a deficiency in a surface of a printed substrate which is executed by the image judgment apparatus.

FIG. 5 is a flowchart showing processing of judging the presence/absence of a deficiency in a surface of a printed substrate which is executed by the image judgment apparatus.

First of all, in step S401, the image judgment apparatus selects one image (image 303) of a judgment target including a specified judgment item with a deficiency code (FCODE). In step S402, the image judgment apparatus segments an image enlarged at a predetermined magnification from the image of the judgment target. In this embodiment, the image judgment apparatus segments images at two types of magnifications specified by a judgment item. For example, when judging the presence/absence of "SR unevenness" as a judgment item (deficiency type), the image judgment apparatus segments a 64×64 pixel image (an image 404 in FIG. 3) from the 256×256 pixel image (the image 303 in FIG. 3) and enlarges the segmented image into a 256×256 pixel image. Likewise, the image judgment apparatus segments a 128×128 pixel image and enlarges it into a 256×256 pixel image. The image judgment apparatus generates two types of enlarged images in this manner.

This judgment item corresponds to the above deficiency type. In this embodiment, two types of magnifications are defined in accordance with the judgment item (deficiency type).

Figure 6:
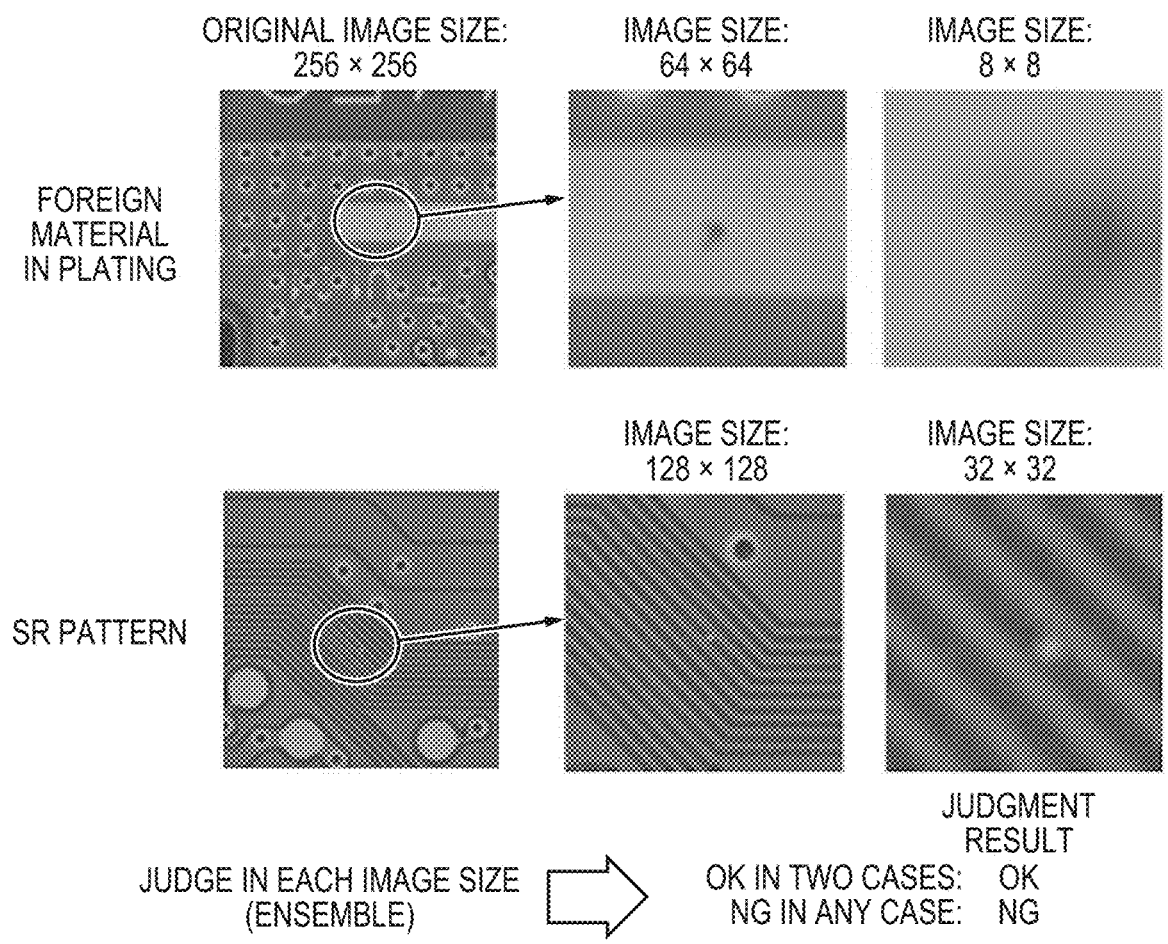
FIG. 6 is a view showing an example of the relationship between judgment items (deficiency types) and two types of enlarged images used for judgment.

FIG. 6 shows an example of the relationship between judgment items (deficiency types) and two types of enlarged images used for the judgment.

Referring to FIG. 6, if the judgment item (deficiency type) is a foreign material in plating, the image judgment apparatus generates images of two sizes, that is, 64×64 pixels and 8×8 pixels, from a 256×256 pixel image. If the judgment item (deficiency type) is an SR pattern, the image judgment apparatus generates images of two sizes, that is, 128×128 pixels and 32×32 pixels, from a 256×256 pixel image.

Assume that the judgment item is a foreign material in plating. Such a deficiency tends to occur in a portion of the wiring pattern on a surface of a printed substrate. It is known that this foreign material is recognized because density (brightness) different from the density (brightness) around the foreign material locally exists. In contrast to this, the wiring pattern is detected as a region having uniform density (brightness) on the image. Accordingly, when a relatively wide region having uniform density (brightness) on an image includes a small region having density (brightness) discontinuously different from that of the wide region, the small region is likely to be a foreign material in plating.

On the other hand, a through hole in a printed substrate is recognized as a small region having density (brightness) discontinuously different from that of the surrounding region on the image. However, a through hole is generally circular and hence can be recognized as a through hole by specifying the shape of a small region having density (brightness) discontinuously different from that of the surrounding region.

In contrast to this, because a foreign material in plating has an uncertain shape, the probability of being able to specify the presence of the foreign material in plating is increased by specifying the shape of the foreign material and specifying a small region having density (brightness) discontinuously different from the surrounding region.

Combining a plurality of factors like those described above can accurately recognize the presence of a target as a judgment item.

It is not always easy to specify the presence of each of a plurality of factors by using the 256×256 pixel image segmented first. This is because this image includes various features of the printed substrate, and a plurality of image processing algorithms are required to find out the presence of one factor from these features while the processing time becomes long. In contrast to this, using an image obtained by segmenting and enlarging a small region including a judgment item will simplify a change in density (brightness) or shape and facilitating specifying the judgment item. In consideration of the design of a printed substrate itself, each judgment item and its surrounding region have certain tendencies in terms of places where their features and factors occur. For this reason, depending on a judgment item, the size (that is, magnification) of an image region where the feature of the item can be most easily grasped varies.

Accordingly, this embodiment is configured to select images obtained at two different enlargement magnifications, which enable the image judgment apparatus to most easily grasp the features, for each judgment item, and use the images for image judgment.

A method of selecting two optimal images will be described here.

This embodiment is configured to perform image judgment with six combinations of images for each deficiency type. As shown in FIG. 4, images having sizes of 128×128 pixels, 64×64 pixels, 32×32 pixels, and 8×8 pixels are generated from an image having a size of 256 pixels×256 pixels. Judgment correct answer rates pertaining to six combinations of images are evaluated to finally select two optimal images. The six combinations of the images are as follows:

(1) the 32×32 pixel image and the 8×8 pixel image;
(2) the 64×64 pixel image and the 8×8 pixel image;
(3) the 128×128 pixel image and the 8×8 pixel image;
(4) the 64×64 pixel image and the 32×32 pixel image;
(5) the 128×128 pixel image and the 32×32 pixel image; and
(6) the 128×128 pixel image and the 64×64 pixel image.

The image judgment apparatus 20 then performs image judgment with the above six combination of the images with respect to each of a plurality of (predetermined number) of test images. A person (expert) visually confirms an image of the judgment results. The person (expert) verifies the correct answer rate of image judgment by judgment confirmation with this visual confirmation.

FIG. 7 is a view for explaining a combination of segmentation sizes concerning one deficiency item.

FIG. 7 shows judgment results of, for example, two images, namely, a 64×64 pixel image and a 128×128 pixel image, and a judgment result (a result of the ensemble) obtained when two images are combined. The judgment result includes "NG correct answer rate", "OK correct answer rate", and "true_NG correct answer rate". Each correct answer rate is expressed in percentage (%).

In this case, "NG correct answer rate" represents the ratio, expressed in percentage (%), of the number of times of NG judgment confirmation also made by the image judgment apparatus 20, of the number of times of NG judgment made by the person (expert), to the number of samples of test images verified concerning the corresponding deficiency item. "OK correct answer rate" represents the ratio, expressed in percentage (%), of the number of times of OK judgment confirmation also made by the image judgment apparatus 20, of the number of times of OK judgment made by the person (expert), to the number of samples of test images verified concerning the corresponding deficiency item. "True_NG correct answer rate" represents the ratio, expressed in percentage (%), of the number of times of NG judgment made by both the image judgment apparatus 20 and the person (expert) to the number of samples of test images verified concerning the corresponding deficiency item.

As is obvious from FIG. 7, the correct answer rate obtained by judgment with a combination of two images having different magnifications is higher than that obtained by judgment with one image having a certain magnification.

This embodiment is configured to perform judgment evaluation like that shown in FIG. 7 with respect to all the six combinations described above. First of all, combinations of segmentation sizes exhibiting "true_NG correct answer rate" of 100% (or the highest value) in ensemble judgment are selected from the six combinations. Combinations of segmentation sizes exhibiting a high "NG correct answer rate" in ensemble judgment are selected from the selected combinations. A combination of segmentation sizes exhibiting a high "true_NG correct answer rate" for each segmentation size is selected from the selected combination. Executing selection in three steps in this manner will select two optimal images.

As a result of the above processing, images having the following sizes were used for judgment of the five deficiency items shown in FIG. 4:

foreign material in plating→32×32 pixels and 128×128 pixels;
  SR pattern shape→32×32 pixels and 128×128 pixels;
  SR stripping→64×64 pixels and 128×128 pixels;
  SR unevenness→32×32 pixels and 64×64 pixels; and
  SR unevenness in fine line pattern→32×32 pixels and 128×128 pixels.

Note that the above processing involves verification by visual confirmation by the person (expert) and learning by the learning unit 240 of the image judgment apparatus 20, and hence the learning will be described below.

Figure 8:
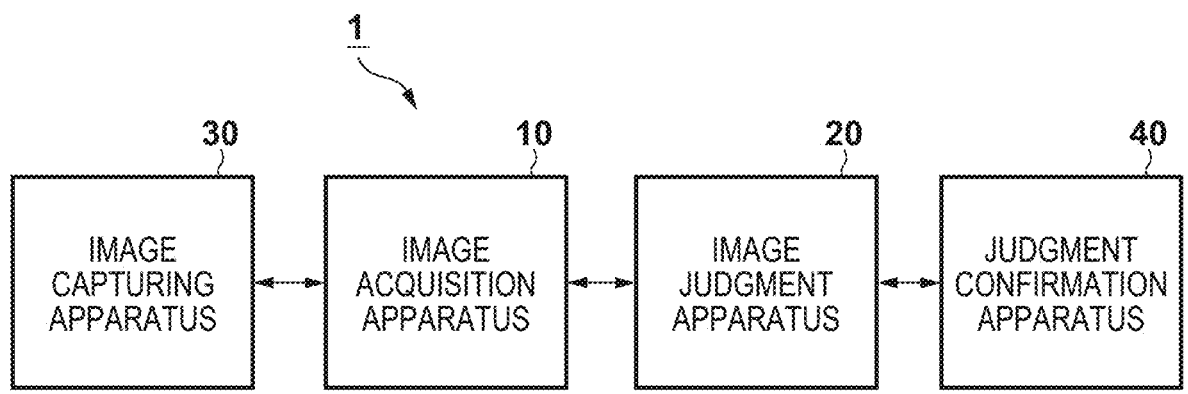
FIG. 8 is a block diagram showing the arrangement of a system for verifying the judgment accuracy of the system shown in FIG. 1.

FIG. 8 is a block diagram showing the arrangement of a system that verifies the judgment accuracy of the system shown in FIG. 1. The same reference numerals as in FIG. 8 denote the same constituent elements described with reference to FIG. 1, and a description of them will be omitted.

Referring to FIG. 8, a judgment confirmation apparatus 40 is provided on the subsequent stage of the image judgment apparatus 20 to receive a judgment result from the image judgment apparatus 20. The person (expert) then visually confirms an image of the judgment result obtained by the judgment confirmation apparatus 40. With this visual confirmation, each target image is classified. The above selection and evaluation are reflected in the learning unit 240 to make it learn them. The learning unit 240 defines an enlargement magnification in accordance with which combination of enlargement magnifications exhibits the highest correct answer rate. Accordingly, when a judgment item (deficiency type) is designated, the learning unit 240 automatically outputs two enlargement magnifications as a learning result.

As described above, changing the combination of segmentation sizes for each judgment item was able to improve the correct answer rate.

Referring back to the flowchart of FIG. 5, in step S403, these two types of enlarged images are input to a learned model.

In step S404, if it is judged that both the images having the two sizes are not deficiency images (OK) concerning the judgment item with respect to an output result from the learning model, the process advances to step S405 to judge that "the images are not deficiency images" with respect to the judgment item. In contrast to this, if it is judged that at least one of the images having the two sizes has a deficiency (NG) with respect to the judgment item, the process advances to step S406 to judge that "the image is a deficiency image" with respect to the judgment item. In step S407, the judgment target image is assigned with a tag indicating an NG image and stored in the third storage unit 213. Such judgment will be referred to as so-called ensemble judgment.

Executing the above processing for each of a plurality of judgment items obtains any of judgment results, namely, "the image is not a deficiency image (OK)" or "the image is a deficiency image (NG)" for each judgment item. In this embodiment, the printed substrate is inspected, and hence the inspection result (good or not good) of the printed substrate is judged based on the judgment result of each of a plurality of judgment items. If, for example, at least one of a plurality of judgment items is judged not good, the printed substrate is judged not good.

Figure 9:
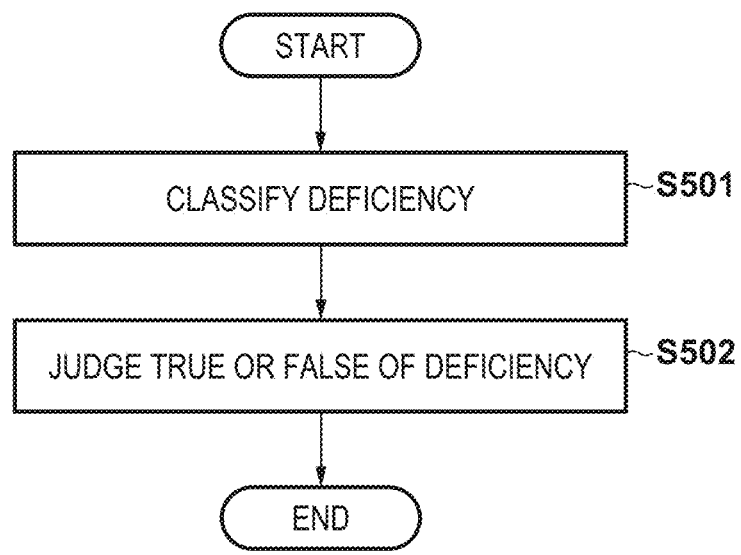
FIG. 9 is a flowchart showing processing of learning an inspection process in inspection steps for a printed substrate and an inspection result.

FIG. 9 is a flowchart showing processing of learning an inspection process in inspection steps for a printed substrate and an inspection result.

In step S501, a printed substrate is inspected to check the presence/absence of an image in which a deficiency is judged. More specifically, as described above, it is judged whether the image obtained by capturing an image of a surface of a printed substrate by using the deficiency detection unit 12 is an image in which a deficiency should be judged. If it is judged that the obtained image is an image in which a deficiency should be judged, a judgment item (deficiency type) is judged. Such inspection is executed for a predetermined number of printed substrates.

Subsequently, in step S502, the image judgment apparatus 20 performs judgment processing for the image obtained by capturing an image of the printed substrate judged as having a deficiency. The judgment confirmation apparatus 40 verifies the judgment result to confirm whether the judgment is OK (correct answer) or NG (wrong answer) when viewed by the person (expert). This verifies what judgment process has guided image judgment to OK (correct answer). Accordingly, the learning unit 240 is made to learn this judgment process.

This learning result revealed that judging a combination of segmentation sizes for each judgment item improved the correct answer rate. Accordingly, after learning, images having optimal enlargement magnifications in which the learning result is reflected according to a judgment item (deficiency type) are used for comparison.

According to the above embodiment, therefore, the judgment accuracy improves, and it is possible to reduce the number of times of judging that an image judged as having no deficiency by the human eye is judged as having a deficiency (false information) by the image judgment apparatus. This can reduce the number of images to be visually recognized and greatly reduce the recognition work.

According to the embodiment described above, the presence/absence of a deficiency was judged by comparing two images having different enlargement magnifications for each deficiency item (deficiency type) with an image based on OK judgment reference data and an image based on NG judgment reference data. However, the present invention is not limited to this. For example, three or more images having different enlargement magnifications may be compared with reference images.

In this case, when an odd number (three or more) of enlarged images are used, the principle of majority rule may be used to finally judge whether there is a deficiency (NG) or no deficiency (OK) for each judgment item. Assume that an even number (four or more) of enlarged images are used. In this case, when the principle of majority rule is used, the number of times of judging that there is a deficiency (NG) may become equal to the number of times of judging that there is no deficiency (OK), resulting in a failure to make final judgment. Accordingly, if the above numbers become equal to each other, it should be finally judged that there is a deficiency (NG).

It is also possible to obtain a judgment result by weighting the judgment result obtained from each of two or more enlarged images having different enlargement magnifications. Assume that two images are used, and the results obtained from one image and the other image are respectively weighted by 0.7 and 0.3. In this case, when the judgment result obtained from the image having a weight of 0.7 is OK, the final judgment is OK even if the judgment result obtained from the image having a weight of 0.3 is NG.

Although the system shown in FIG. 1 includes the image acquisition apparatus 10 and the image judgment apparatus 20 as discrete arrangements, the system may use an apparatus with a unitized arrangement obtained by integrating the two apparatuses.

The size of the reference image 305 described above, that is, the size of an image as a judgment target (comparison target), is not limited to 256 pixels×256 pixels, and may be another size. For example, the size may be 224 pixels×224 pixels.

The deficiency detection unit 12 described with reference to FIG. 2A may hold CAD data as reference image data and compare the CAD data with the image data received from the image capturing apparatus 30. Although the embodiment configured to judge an image estimated to have deficiencies with respect to a plurality of judgment items has been described by exemplifying print inspection, an image may be judged with regard to one judgment item depending on the contents of inspection.

In executing image selection described with reference to FIG. 7, this operation is not limited to the 3-step selection described above. For example, when priority is given to the execution of selection in a short period of time, 2-step selection or 1-step selection may be performed. Assume that 2-step selection is performed. In this case, after selection of combinations of segmentation sizes exhibiting "true_NG correct answer rate" of 100% (or the highest value) in ensemble judgment, a combination of segmentation sizes exhibiting the high "NG correct answer rate" in ensemble judgment is selected from the selected combinations. Assume that 1-step selection is performed. In this case, for example, a combination of segmentation sizes exhibiting "true_NG correct answer rate" of 100% (or the highest value) in ensemble judgment is selected. Alternatively, a combination of segmentation sizes exhibiting high "true_NG correct answer rate" may be selected for each segmentation size. In addition, any of 3-step selection, 2-step selection, and 1-step selection may be selected for each judgment item in accordance with the judgment accuracy, the time required for judgment, and the like.

Furthermore, the above embodiment has exemplified a semiconductor substrate or printed substrate as a "substrate". However, the embodiment may be applied to a flexible printed circuit (FPC) having wirings formed on a single surface or double surfaces, with the surface layer covered by a protective film.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-176045, filed Sep. 26, 2019, which is hereby incorporated by reference herein in its entirety.

What is claimed is:

1. An image judgment apparatus that judges quality of an image by using a plurality of judgment items, the apparatus comprising:
    a judgment model configured to learn about each of the plurality of judgment items based on first data corresponding to an image as a reference with which to judge good and second data corresponding to an image as a reference with which to judge not good;
    a setting unit configured to set a plurality of magnifications for each of the plurality of judgment items;
    a generating unit configured to segment part of the image and generate image data at the plurality of magnifications set by the setting unit from the segmented image; and
    a judgment unit configured to input, to the judgment model, the image data, corresponding to each of the plurality of magnifications, generated by the generating unit and judge, based on output results from the judgment model, whether the quality of the image is good or not good with respect to each of the plurality of judgment items.

2. The apparatus according to claim 1, wherein the plurality of magnifications set by the setting unit are defined based on a verification result obtained by verifying judgment results obtained by the judgment unit concerning a plurality of images.

3. The apparatus according to claim 2, further comprising a learning unit configured to learn the verification result and reflect the verification result in judgment by the judgment unit.

4. The apparatus according to claim 1, wherein the judgment unit judges the quality of the image as good if the plurality of magnifications are a first magnification and a second magnification as two different magnifications and both an output result obtained by the judgment model concerning image data with the first magnification and an output result obtained by the judgment model concerning image data with the second magnification are good, and judges the quality of the image as not good if either of an output result obtained by the judgment model concerning image data with the first magnification and an output result obtained by the judgment model concerning image data with the second magnification is not good.

5. The apparatus according to claim 1, wherein the image is acquired by causing an image capturing apparatus to capture an image of an inspection target.

6. The apparatus according to claim 5, wherein image data corresponding to the image acquired by the image capturing apparatus is compared in advance with image data corresponding to a reference image corresponding to the image to specify a position as an inspection target in the image as a judgment target and a judgment item at the position from the comparison.

7. The apparatus according to claim 6, wherein the segmented image is acquired from the image based on the specified position.

8. The apparatus according to claim 6, wherein the setting unit sets the plurality of magnifications according to the specified judgment item.

9. The apparatus according to claim 5, wherein the inspection target includes a printed substrate, a glass substrate, a semiconductor substrate, and a head substrate provided with a print element used as a head chip of an inkjet printhead and a wiring.

10. The apparatus according to claim 9, wherein the plurality of judgment items include presence/absence of a foreign material in plating, a shape of an SR pattern, an SR stripping, SR unevenness, a position of a through hole, a fine line pattern, a plate stripping, a shape of a pad, and a plating color, on the printed substrate.

11. An image judgment method in an image judgment apparatus that judges quality of an image by using a plurality of judgment items, the method comprising:
  storing, in a memory, a judgment model configured to learn about each of the plurality of judgment items based on first data corresponding to an image as a reference with which to judge good and second data corresponding to an image as a reference with which to judge not good;
  setting a plurality of magnifications for each of the plurality of judgment items;
  segmenting part of the image and generating image data at the plurality of magnifications from the segmented image; and
  inputting, to the judgment model, the generated image data corresponding to each of the plurality of magnifications and judging, based on output results from the judgment model, whether the quality of the image is good or not good with respect to each of the plurality of judgment items.

12. The method according to claim 11, wherein the plurality of set magnifications are defined based on an inspection result obtained by verifying judgment results concerning a plurality of images.

13. The method according to claim 12, further comprising learning the verification result and reflecting the verification result in the judgment.

14. The method according to claim 11, wherein in the judging, the quality of the image is judged as good if the plurality of magnifications are a first magnification and a second magnification as two different magnifications and both an output result obtained by the judgment model concerning image data with the first magnification and an output result obtained by the judgment model concerning image data with the second magnification are good, and the quality of the image is judged as not good if either of an output result obtained by the judgment model concerning image data with the first magnification and an output result obtained by the judgment model concerning image data with the second magnification is not good.

15. The method according to claim 11, wherein the image is acquired by causing an image capturing apparatus to capture an image of an inspection target.

16. The method according to claim 15, wherein image data corresponding to the image acquired by the image capturing apparatus is compared in advance with image data corresponding to a reference image corresponding to the image to specify a position as an inspection target in the image as a judgment target and a judgment item at the position from the comparison.

17. The method according to claim 16, wherein the segmented image is acquired from the image based on the specified position.

18. The method according to claim 16, wherein in the setting, the plurality of magnifications are set according to the specified judgment item.

19. The method according to claim 15, wherein the inspection target includes a printed substrate, a glass substrate, a semiconductor substrate, and a head substrate provided with a print element used as a head chip of an inkjet printhead and a wiring.

20. The method according to claim 19, wherein the plurality of judgment items include presence/absence of a foreign material in plating, a shape of an SR pattern, an SR stripping, SR unevenness, a position of a through hole, a fine line pattern, a plate stripping, a shape of a pad, and a plating color, on the printed substrate.

* * * * *